US005387764A

United States Patent [19]

Blom et al.

[11] Patent Number: 5,387,764

[45] Date of Patent: Feb. 7, 1995

[54] ELECTRICAL CONNECTOR FOR INTERCONNECTING COAXIAL CONDUCTOR PAIRS WITH AN ARRAY OF TERMINALS

[75] Inventors: Hans A. Blom, Portland; Laurence A. Daane, Sherwood; Paul C. Sprunger, Dundee; Paul A. Wheatcraft, Tualatin, all of Oreg.

[73] Assignee: The Whitaker Corporation, Wilmington, Del.

[21] Appl. No.: 57,269

[22] Filed: May 4, 1993

[51] Int. Cl.[6] .......... H05K 1/02

[52] U.S. Cl. .......... 174/261; 174/35 R; 174/262; 439/63; 439/88; 361/816

[58] Field of Search .......... 439/63, 88; 361/816, 361/792; 174/35 R, 261, 262, 266

[56] References Cited

U.S. PATENT DOCUMENTS

| | | | |
|---|---|---|---|
| 3,689,865 | 9/1972 | Pierini et al. | 339/17 L |
| 4,273,407 | 6/1981 | Snuffer et al. | 339/177 |
| 4,734,046 | 3/1988 | McAllister et al. | 439/101 |
| 4,929,195 | 5/1990 | Seidoh | 439/610 |
| 5,120,258 | 6/1990 | Carlton | 439/581 |

*Primary Examiner*—Leo P. Picard
*Assistant Examiner*—L. Thomas

[57] ABSTRACT

A connector for electrically and mechanically interconnecting multiple pairs of small coaxial conductor pairs includes a shield bus layer and signal conductor traces on opposite sides of a flexible dielectric substrate. Terminal portions of the signal conductor traces span an opening through the connector giving access to each signal conductor trace for soldering the traces to arrayed terminals on a circuit assembly, and are located accurately, so that mass soldering techniques can be utilized, with the connector located with respect to the circuit assembly by registration pins and holes. Portions of the shield bus are exposed to be soldered to a respective terminal on a circuit assembly, and to allow the shield conductors of the coaxial pairs to be soldered to the shield bus layer. Thermal breaks are defined in the shield bus layer to protect soldered junctions between the signal conductor traces and the signal conductors of coaxial pairs and the terminals of the circuit assembly. Solder verification holes are provided in the shield bus terminal zone to verify adequate, suitable, satisfactory connection.

41 Claims, 8 Drawing Sheets

ELECTRICAL CONNECTOR FOR INTERCONNECTING COAXIAL CONDUCTOR PAIRS WITH AN ARRAY OF TERMINALS

BACKGROUND OF THE INVENTION

The present invention relates to interconnection of pairs of small coaxial conductors to terminals of electrical circuits and particularly relates to connecting many very small coaxial conductor pairs to closely spaced conductor terminals located in a planar array on a printed circuit.

It has previously been known to arrange small conductors to extend parallel across an opening such as a slot defined in a flex circuit substrate and oriented transverse to the length of the parallel conductors, in order to facilitate connecting the conductors electrically to other conductors. Forming such connections quickly and dependably, however, has not been easy to accomplish.

It has previously been known, as is disclosed in U.S. patent application Ser. No. 07/914,858, assigned to the assignee of the present application, to arrange and hold multiple individual conductors of a cable in a desired sequence for connection to an array of terminals, with the conductors extending across an opening defined in a transfer frame formed of a thin layer of a dielectric material such as is used as a substrate of a printed circuit board. Such a transfer frame is removed from the conductors after they have been electrically connected and mechanically fastened to terminals of an array. Using the prior art, however, it has been difficult, time-consuming, and sometimes impossible, depending on the type of conductors in the cable involved, to maintain the location of each individual conductor accurately enough to make it possible to connect the conductors electrically, in a single, mass-termination operation to an array of small terminals as may be provided on a printed circuit with close conductor and terminal spacing. While it is possible to connect such conductors one-by-one to terminals arrayed on a printed circuit board or otherwise, such a procedure is difficult, tedious, and undesirably time-consuming.

One source of difficulty in connecting flex circuits to printed circuit boards in the past has been that it has been difficult or impossible to determine whether adequate fusion of solder has taken place to create a secure electrical and mechanical connection.

Another source of difficulty has been the problem of controlling heat transfer to accomplish necessary heating in some places without overheating occurring in other places.

What is needed, then, is an improved connector, for facilitating the secure and rapid connection of large numbers of coaxial conductor pairs as are present in some flexible cables, keeping the individual coaxial conductor pairs in order and aligned with one another securely and accurately enough to enable connection of the cable to an electronic circuit assembly using mass termination procedures, and occupying a minimum amount of space on the electronic circuit assembly to which connection is being made.

SUMMARY OF THE INVENTION

The present invention provides an answer to the aforementioned need for an improved connector and provides a method for easily connecting multiple shielded conductors such as coaxial conductor pairs of a multi-conductor cable to an electronic circuit assembly. According to the invention the connector includes a shield bus conductor and signal conductors arranged on opposite sides of a thin central layer of a dielectric material. A shield bus connection zone is exposed adjacent a signal conductor connecting zone to allow the shield and center conductors of respective coaxial conductor pairs to be connected to the shield bus and to the respective signal conductors at one end of the connector. A shield bus terminal zone is exposed at the opposite, terminal end of the connector, so that the shield bus terminal zone can be electrically connected easily to a corresponding terminal on circuit assembly to which the conductors are to be connected electrically. Additionally, each of the signal conductors is held precisely located, extending across a signal conductor termination window defined in the layer of dielectric material, near the terminal end of the connector. Each signal conductor is located in a position corresponding to the appropriate circuit conductor terminal in an array of such terminals defined on the electronic circuit assembly to which the connector is used to connect the coaxial conductor pairs.

In a preferred embodiment of the invention the shield bus terminal zone is tinned and solder flow verification holes extend through the shield bus conductor in the shield bus terminal zone, to aid in verifying that mechanical and electrical connection of the shield bus terminal zone to the appropriate terminal of a printed circuit has been achieved.

In a preferred embodiment of the invention openings are provided in the shield bus conductor to act as barriers to conduction of heat, in order to make soldering of the shield bus more efficient and less likely to overheat adjacent areas where central conductor connections are located.

In a preferred embodiment of the invention signal conductors and the shield bus conductor are provided as conductive metal foil adhesively attached to opposite sides of a central layer of dielectric material and shaped by conventional techniques such as photoresist etching to leave the desired shapes of conductor traces and shield bus layer, and additional layers of dielectric material are adhesively attached to cover portions of the signal conductors and shield bus which need not be exposed in order to effect connections using the connector.

According to the method of the invention, signal conductors are provided in precise locations and the connector is located accurately on a circuit assembly. Connection to the circuit assembly is thereafter accomplished by application of heat and pressure simultaneously to several of the signal conductors.

It is thus a principal object of the present invention to provide an improved connector for use in interconnecting multiple shielded conductor pairs to an array of terminals located on a circuit assembly.

It is also a principal object of the present invention to provide an improved method for connection of a cable including a large number of shielded conductors to a circuit assembly including an array of terminals.

It is an important feature of the connector according to the present invention that it includes a shield bus conductor to which shield conductors of individual coaxial pairs can be connected, as well as signal conductor traces to which the central, or signal conductors of individual coaxial conductor pairs can be connected, together with a termination window spanned by each of the signal conductor traces of the connector, so that the signal conductor traces and shield bus conductor can be soldered easily to an array of terminals on a circuit assembly.

In a preferred embodiment of the invention the portions of the shield bus to which connections are to be made and the portions of each of the signal conductors of the connector to which connections are to be made are tinned, to facilitate accomplishing electrical and mechanical connection of the connector to an array of terminals in a circuit assembly.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 1:
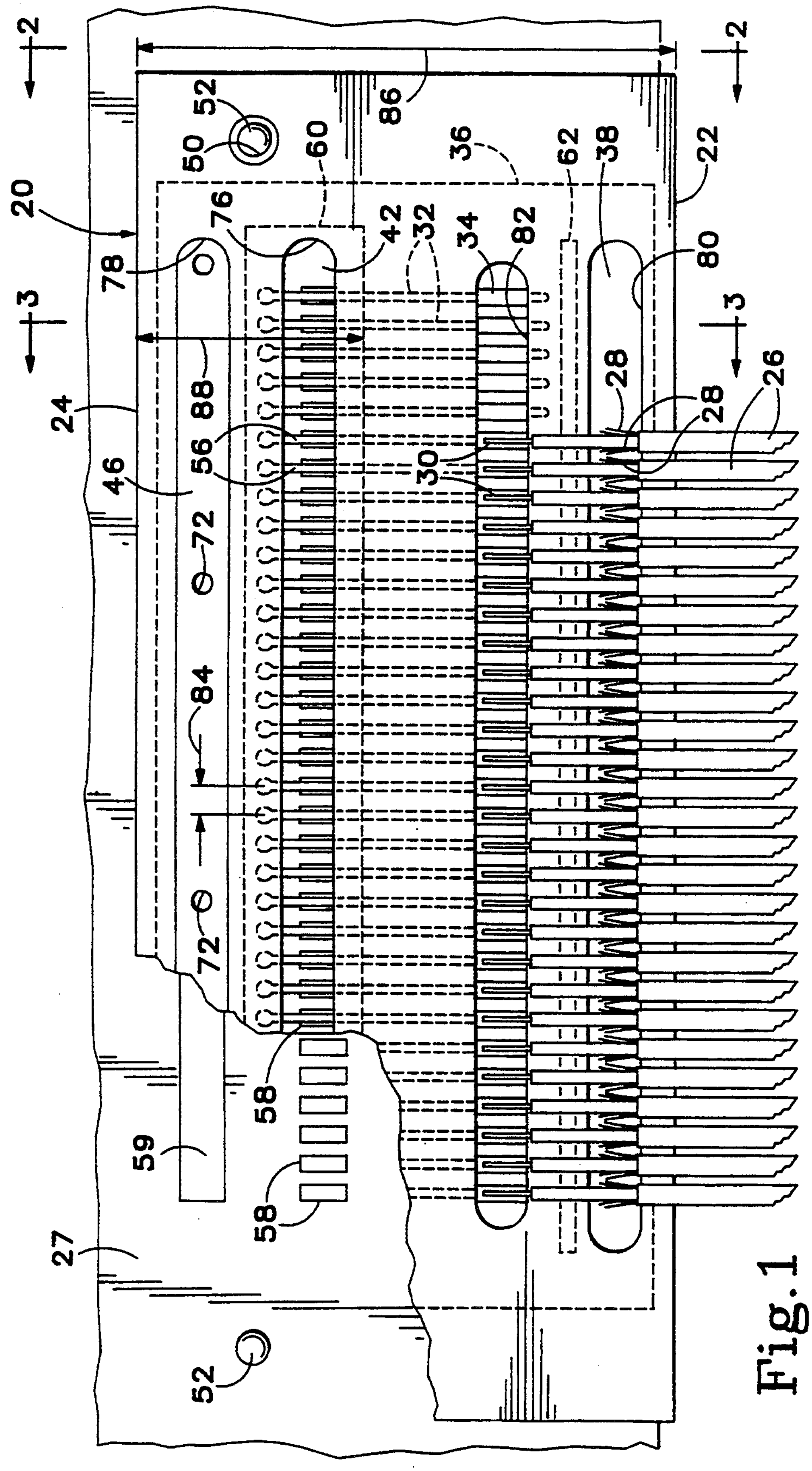
FIG. 1 is a partially cut-away top plan view of a connector which is a preferred embodiment of the invention, shown connecting several coaxial pairs of conductors electrically and mechanically with a portion of an electronic circuit assembly including an array of circuit conductor terminals.
Figure 2:
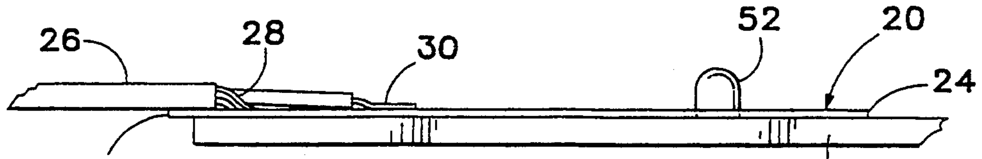
FIG. 2 is a sectional view, taken along line 2—2, of the connector shown in FIG. 1 together with a coaxial pair of conductors connected through the connector to a circuit board.

Referring now to FIGS. 1–8 of the drawings, a connector 20, which is a preferred embodiment of the invention, includes a cable connection end 22 and a terminal connection end 24. A plurality of coaxial conductor pairs 26 are connected to the cable connection end 22 as will be explained in greater detail presently, and the connector 20 is mechanically and electrically connected to an electrical circuit 27 of which a portion is shown in FIG. 1.

Each of the coaxial conductor pairs 26 includes a respective outer or shield conductor 28 and a central or signal conductor 30. Each central or signal conductor 30 is mechanically and electrically connected to a respective signal conductor trace 32 in a signal conductor connecting zone 34 of the connector 20, while the shield conductors 28 are connected to an electrically conductive shield bus conductor layer 36 in a shield conductor connection zone 38 defined on the shield bus layer 36. From the signal conductor connecting zone 34 the signal conductor traces 32 extend parallel with each other toward the terminal connection end 24 of the connector 20.

Figure 3:
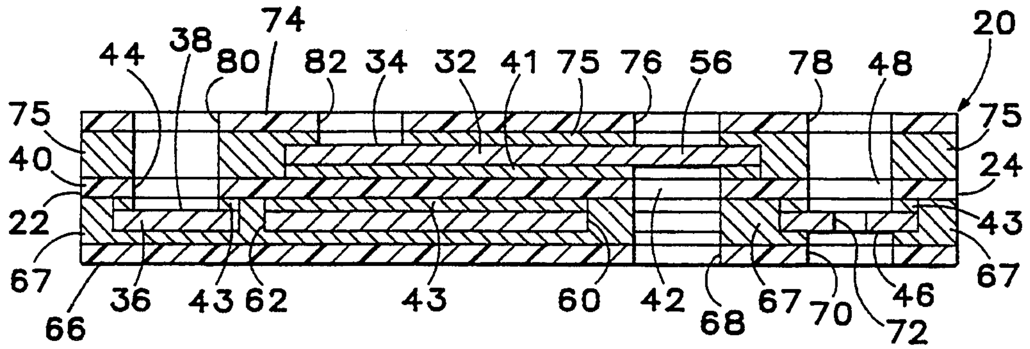
FIG. 3 is a sectional view of the connector shown in FIG. 1, taken along line 3—3, with the scale in the direction of the thickness of the connector exaggerated for the sake of clarity.
Figure 10:
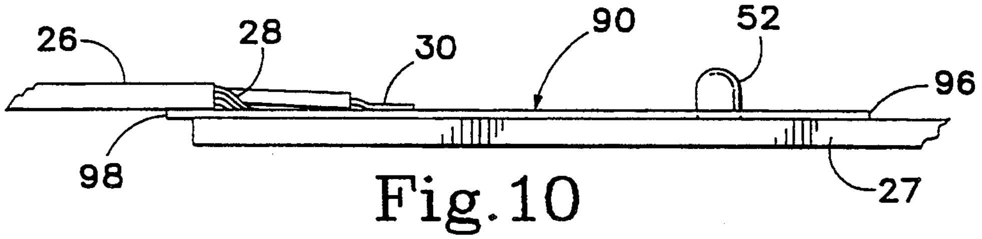
FIG. 10 is a sectional view, taken along line 10—10, of the connector shown in FIG. 9 together with a coaxial pair of conductors connected through the connector to a circuit board.

The signal conductor traces 32 and the shield bus layer 36 are supported by and adhesively attached to a flexible central layer 40 of dielectric material. A suitable material for the central layer 40 is a 1 mil sheet of material such as a somewhat flexible dielectric material which is able to withstand temperatures associated with soldering, for example, a tough flexible polymeric dielectric material such as a polyimide available from E. I. DuPont de Nemours and Company of Wilmington, Del., under the trademark KAPTON™, commonly known for use as a flex circuit substrate. The signal conductor traces 32 and the shield bus layer 36 may, for example, be of 1.0 ounce rolled annealed copper foil (approximately 0.0014″ thick), with the shapes of the signal traces 32 being produced by conventional techniques such as photoresist etching to remove the unwanted material surrounding the signal conductor traces 32 after the layer of foil defining the signal conductor traces 32 is attached to the central layer 40. The signal conductor traces 32 and the shield bus layer 36 are attached to opposite sides of the central layer 40 by a suitable adhesive, such as 1 mil-thick layers 41, 43 of an electrically non-conductive acrylic adhesive of the sort commonly used in flex circuit technology, as shown in FIG. 3.

The central layer 40 defines a signal conductor termination window 42. This is an elongate opening through the central layer 40, oriented parallel with the terminal connection end 24 and transverse to the signal conductor traces 32, and is spanned by each of the signal conductor traces 32. The central layer 40 also defines a shield conductor connection window 44, open through the central layer 40 to expose the shield conductor connection zone 38 on the upper surface of the shield bus layer 36.

Between the signal conductor termination window 42 and the terminal connection end 24 of the connector 20 is a shield bus terminal zone 46 defined in the shield bus layer 36 and having an upper side exposed on the top of the connector 20 through a shield bus terminal zone window 48 defined in the central layer 40 of dielectric material.

A pair of registration pin holes 50 extend through the connector 20 at respective locations at the sides of the connector, preferably close to the signal conductor termination window 42 and the shield bus terminal zone window 48. Registration pins 52 project outward from the electrical circuit 27 to which the connector 20 connects the coaxial pairs 26, matingly extending through the registration pin holes 50 to locate the connector 20 with respect to the electrical circuit 27. The registration pin holes 50 and the various windows through the dielectric material may be produced by lasers under computer control, by die cutting, or by other means conventionally used in preparation of flex circuits.

A termination portion 56 of each signal conductor trace 32 spans the signal conductor termination window 42 and is located above and in registration with a respective circuit conductor terminal 58 of an array of such circuit conductor terminals 58 defined on the exposed surface of the electrical circuit 27 when the registration pins 52 are in the registration pin holes 50. Similarly, the shield bus terminal zone 46 is thus held in a location in which it is above and in registration with a corresponding circuit conductor terminal 59 of the array.

Figure 6:
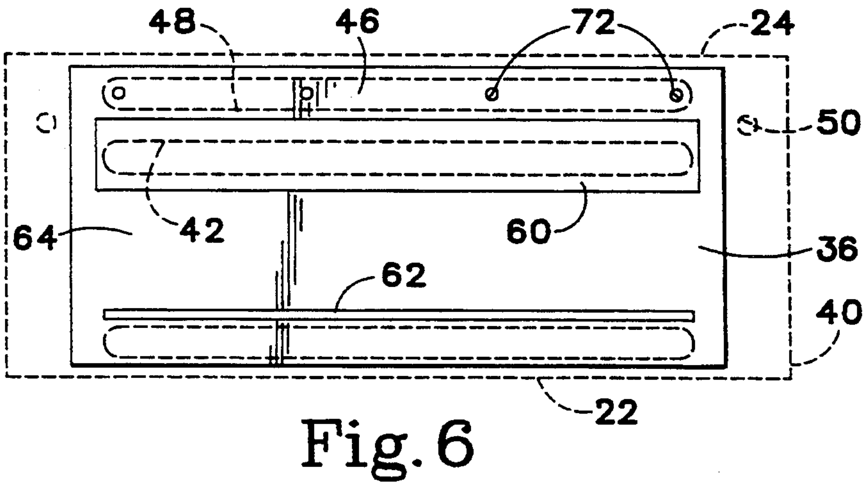
FIG. 6 is a top plan view of the shield bus layer of the connector shown in FIG. 1 together with which the central layer of dielectric material is shown in phantom.
Figure 7:
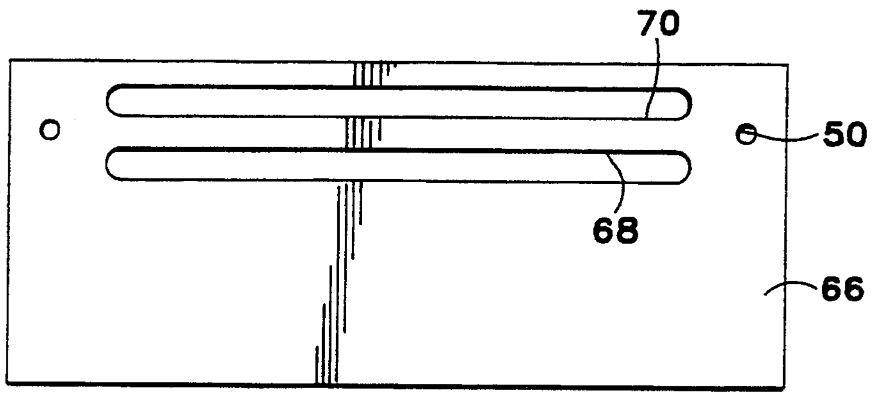
FIG. 7 is a top plan view of a bottom layer of insulating dielectric material which is part of the connector shown in FIG. 1.
Figure 8:
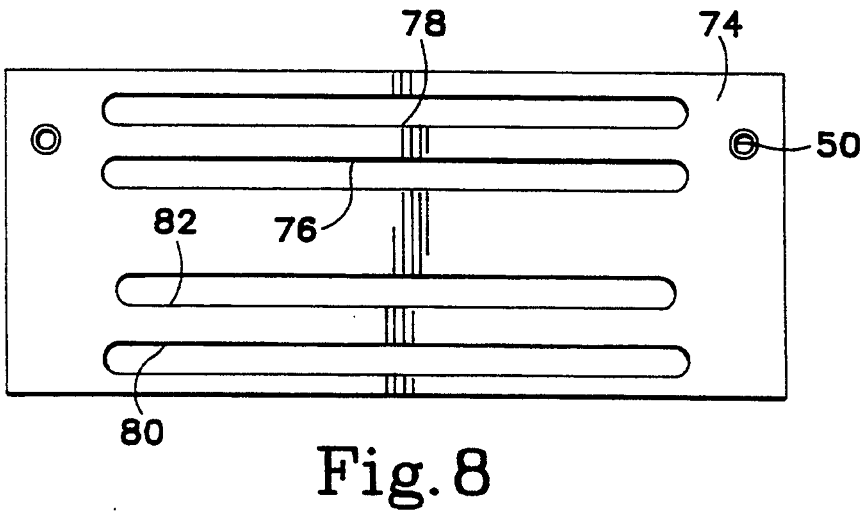
FIG. 8 is a top plan view of a top layer of insulating dielectric material which is part of the connector shown in FIG. 1.
Figure 9:
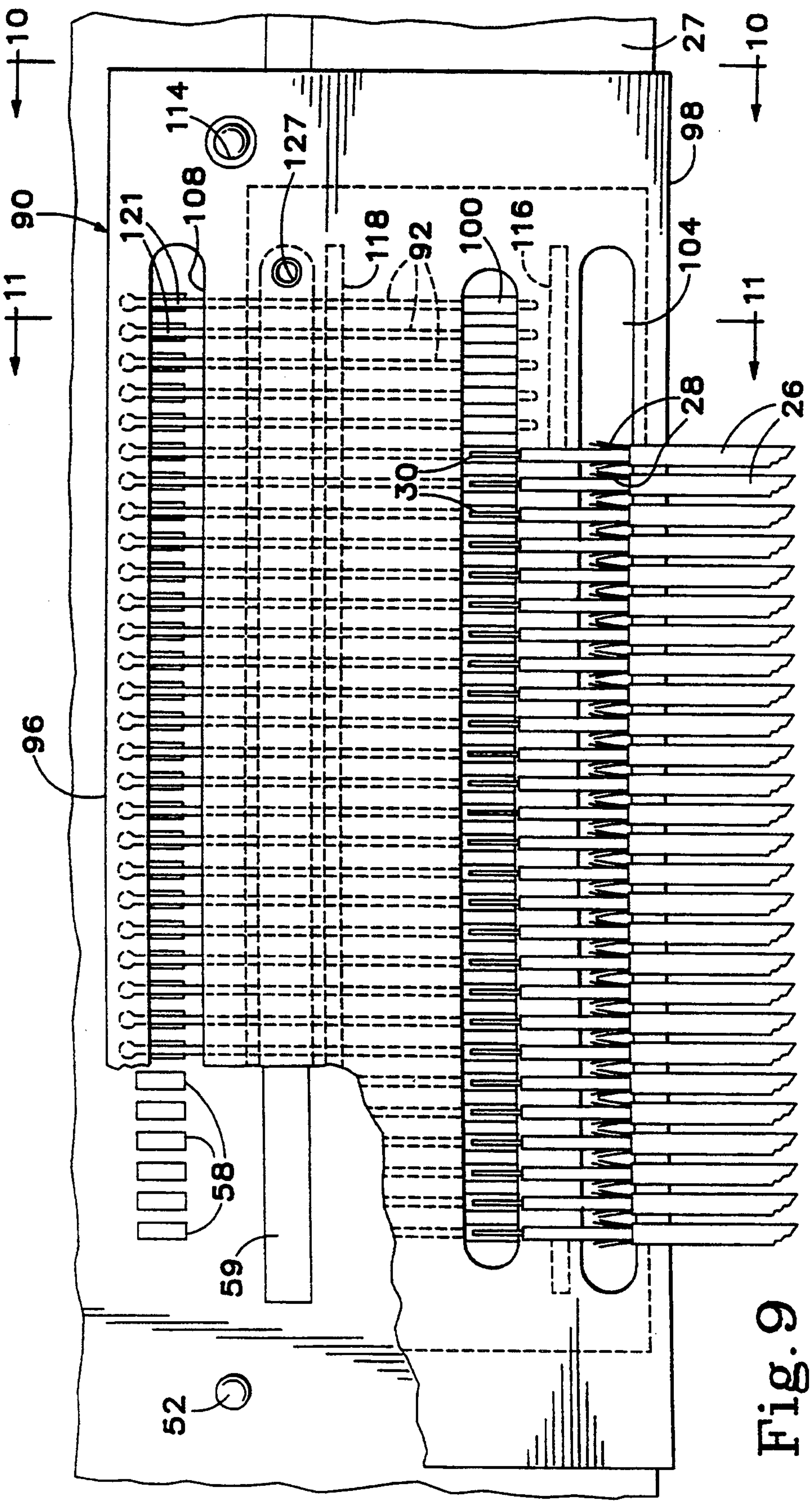
FIG. 9 is a partially cut-away top plan view of a connector which is an alternative embodiment of the present invention, shown connecting several coaxial conductor pairs electrically and mechanically with a portion of an electronic circuit assembly including an array of circuit conductor terminals.
Figure 12:
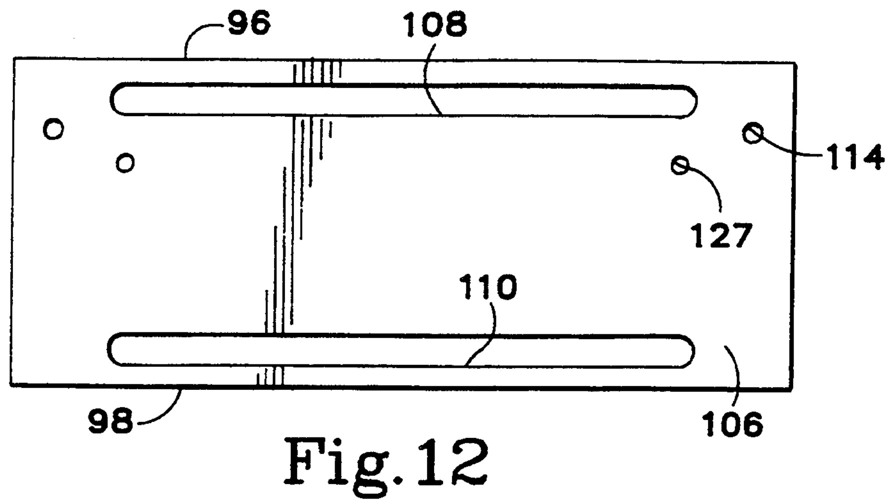
FIG. 12 is a top plan view, at a reduced scale, of the central layer of dielectric material of the connector shown in FIG. 9.
Figure 13:
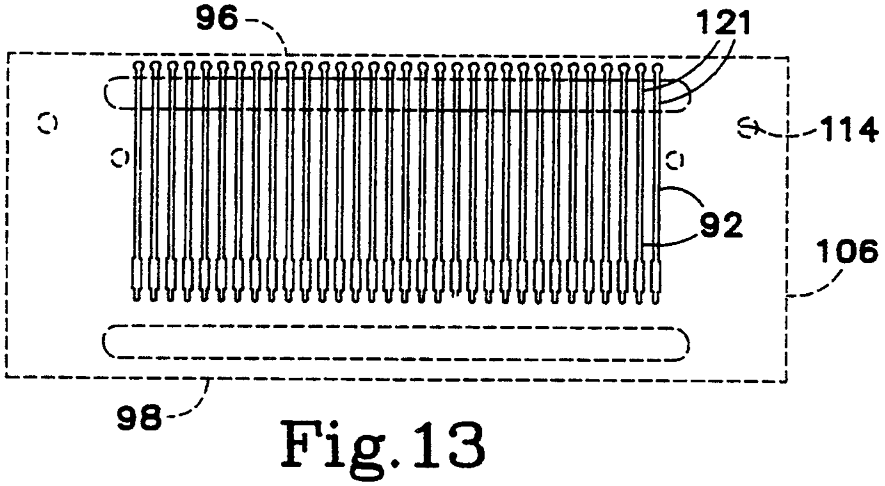
FIG. 13 is a top plan view of the signal conductors of the connector shown in FIG. 9, together with which the central layer of dielectric material is shown in phantom.

Referring now also to FIG. 6 it will be seen that the shield bus layer 36 defines a thermal break opening 60 surrounding the signal conductor termination window 42. A thermal break opening 62 defined in the shield bus layer is located between the shield conductor connection zone 38 and the signal conductor connecting zone 34, near the cable connection end 22 of the connector 20. The opening 60 and the thermal break opening 62 limit the transfer of heat through the shield bus layer 36, between the shield conductor connection zone 38 and the signal conductor connecting zone 34, and between the shield bus terminal zone 46 and the signal conductor trace terminal portions 56. The opening 60 and thermal break opening 62 thus confine and make more efficient use of heat during soldering of the shield bus terminal zone to the corresponding shield terminal 59, and in soldering shield conductors 28 to the shield conductor connection zone 38. At the same time the opening 60 and thermal break opening 62 protect the connections of the central conductors 30 to the signal conductor traces 32 and protect the connections of the signal conductor traces 32 to the respective terminals 58 from being overheated. Nevertheless, a central portion 64 of the shield bus layer 36 extends along the majority of the length of each of the signal conductor traces 32 and along the portions of the central conductors 30 which extend beyond the shield conductor connection zone 38 toward the signal conductor connecting zone 34.

An insulating bottom layer 66 of dielectric material, which may be similar to the material of the central layer 40, is attached to the shield bus layer 36 by a layer 67 (FIG. 3) of adhesive similar to the previously mentioned layer 43 of adhesive connecting the shield bus layer 36 to the central layer 40. The bottom layer of dielectric material 66 defines an opening 68, located in registration with the signal conductor termination window 42, and an opening 70, located in registration with the shield bus terminal zone window 48 defined in the central layer of dielectric material 40.

Solder flow verification openings 72 are defined through the shield bus terminal zone 46 of the shield bus layer 36 to enable a visual inspection to reveal whether the solder has flowed sufficiently to effect satisfactory mechanical and electrical interconnection between the shield bus terminal zone 46 and the corresponding conductor terminal 59 of the circuit 27.

Preferably, in order to provide additional insulation against incidental electrical contacts, as well as mechanical protection for the signal conductor traces 32, the connector 20 includes a top layer 74 of dielectric material attached to the central layer 40 and the signal conductor traces 32 by a layer 75 of adhesive (FIG. 3). The top layer 74 may be of material similar to that used for the central layer 40 and bottom layer 66 of dielectric material, and the adhesive of the layer 75 may also be similar to that used to attach the previously mentioned layers mechanically to one another.

The top layer 74 defines an window 76, located in registration with the signal conductor termination window 42, and an window 78, located in registration with the shield bus terminal zone window 48 defined by the central layer 40, near the terminal connection end 24 of the connector 20. Near the cable connection end 22 of the connector 20, the top layer 74 also defines an window 80 located above and in registration with the shield conductor connection zone 38 and the shield conductor connection window 44. The top layer 74 of dielectric material also defines an window 82 exposing the signal conductor connecting zone 34 of the signal conductor traces 32, to permit the central or signal conductors 30 to be soldered to the respective conductor traces 32.

Preferably, during manufacture of the connector 20, each of the signal conductor traces 32 is tinned in the signal conductor connecting zone 34, and the shield bus layer 36 is tinned in the shield conductor connection zone 38, to facilitate connection of the coaxial conductor pairs 26 to the connector 20. At least the bottom surface of the shield bus terminal zone 46, that is, the surface exposed through the opening 70 and facing downward toward the circuit 27 as shown in FIG. 1, is also tinned. All tinned areas are preferably plated with eutectic solder including about 63% tin, to a thickness in the range of 350 to 650 micro-inches.

A large number of coaxial conductor pairs 26 can be connected to the connector 20, as by soldering the several shield conductors 28 and signal conductors 30 of the coaxial conductor pairs 26 to the connector 20, in the respective locations required to correspond with the arrayed circuit conductor terminals 58 of an electrical circuit 27 to which connection is to be made. For extremely small coaxial conductor pairs 26 this may require each individual shield conductor 28 and central conductor 30 to be soldered to the connector 20 by hand. The connector 20 then remains connected with the coaxial conductor pairs 26, which may, for example, be a group of conductor pairs forming a multi-conductor cable. The cable can be produced and its conductor pairs may be connected to the connector 20 at an appropriate location, and the cable thereafter may be shipped together with the attached connector 20 to the location where the cable is to be connected to the electrical circuit 27 without disturbing the arrangement of the individual conductor coaxial conductor pairs 26.

The connector 20 is thereafter placed appropriately on the electrical circuit 27, with the registration pins 52 extending through the registration pin holes 50 to locate the connector 20 appropriately with respect to the circuit conductor terminals 58, and then mass solder reflow techniques may be utilized to quickly and completely connect the connector 20 electrically and mechanically to the electrical circuit 27. The signal conductor termination window 42 permits each of the signal conductor traces 32 to be soldered to the respective circuit conductor 58, and permits each solder connection to be visually inspected, and, if necessary, repaired. The accessibility of the shield bus terminal zone 46, through the window 78 in the top layer 74 of dielectric material and the shield conductor connection window 44 defined in the central layer 40, similarly permits direct application of heat to solder the shield bus terminal zone 46 to the appropriate conductor terminal 59. The solder flow verification openings 72 also permit simple visual verification of solder flow, as previously mentioned, where the terminal zone 46 is connected to a shield conductor terminal 59 of the electrical circuit 27.

A connector 20 can be manufactured with very small spacing between adjacent ones of the signal conductor traces 32, so that center-to-center spacing 84 between the signal conductor trace terminal portions 56 is 0.025" or less, and the overall length 86 of the connector 20 may be, for example, about 0.5" or less, with the total length 88 of the portion of the connector including the signal conductor termination window and the shield bus termination zone being about 0.2" or less, so that connectors 20 can be overlapped, shingle-fashion, with a separation of as little as 0.25" per connector, measured longitudinally of the connectors 20.

Referring next to FIGS. 9–16, a connector 90 is generally similar to the connector 20, but has signal conductor traces 92, corresponding to signal traces 32 of the connector 20, which extend beyond the electrically conductive shield bus layer 94 at the terminal connection end 96 of the connector 90. This arrangement requires some structural differences from the connector 20, in order to avoid heat transfer problems.

The connector 90 also includes a cable connection end 98, where a plurality of coaxial conductor pairs 26 are connected in the same way as to the cable connection end 22 of the connector 20. Each central or signal conductor 30 is mechanically and electrically connected to a respective signal conductor trace 92 in a signal conductor connecting zone 100 while the shield conductors 28 are connected to the shield bus layer 94 in a shield conductor connection zone 104 defined on the shield bus layer 94.

From the signal conductor connecting zone 100 the signal conductor traces 92 extend parallel with each other toward the terminal connection end 96 of the connector 90. The signal conductor traces 92 are supported by and adhesively attached to a central layer 106 of dielectric material. The signal conductor traces 92 and the shield bus layer 94 are attached by respective layers 103 and 105 of an adhesive to opposite sides of the central layer 106.

The central layer 106 defines a signal conductor termination opening 108, adjacent the terminal connection end 96 of the connector 90, which is spanned by each of the signal conductor traces 92. The central layer 106 also defines a shield conductor connection window 110, an opening through the central layer 106 to expose the shield conductor connection zone 104 on the upper surface of the shield bus layer 94.

Between the signal conductor termination window 108 and the signal conductor connecting zone 100 of the connector 90 is a shield bus terminal zone 112, a portion of the shield bus layer 94 located beneath the central layer 106 of dielectric material and the central portion of the length of the signal conductor traces 92.

A pair of registration pin holes 114, corresponding to the registration pin holes 50 of the connector 20, extend through the connector 90 at respective locations at the sides of the connector 90, preferably close to the signal conductor termination window 108 and the shield bus terminal zone 112.

Figure 14:
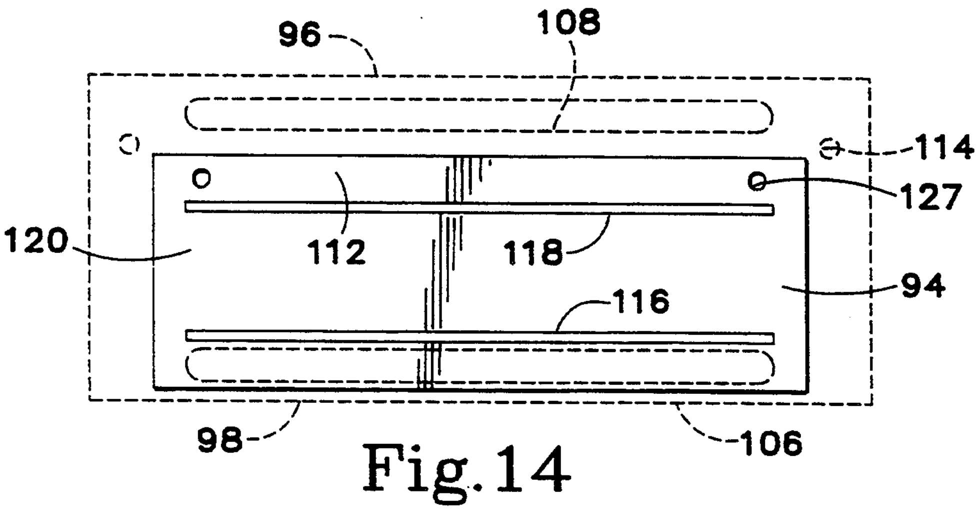
FIG. 14 is a top plan view of the shield bus layer of the connector shown in FIG. 9, together with which the central layer of insulating material is shown in phantom.
Figure 15:
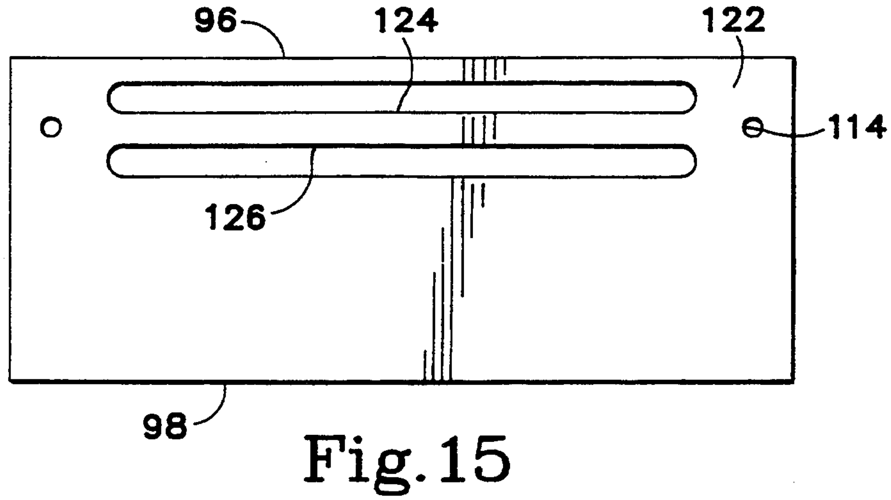
FIG. 15 is a top plan view of a bottom layer of insulating dielectric material which is part of the connector shown in FIG. 9.
Figure 16:
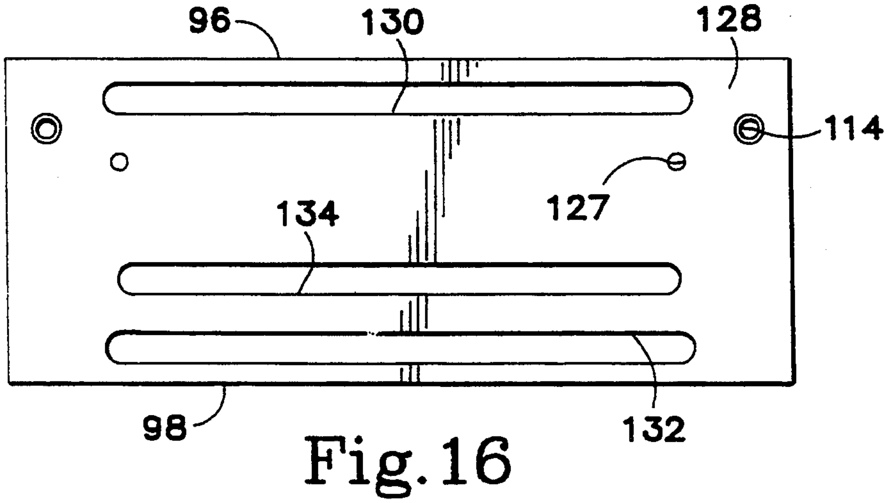
FIG. 16 is a top plan view of a top layer of insulating dielectric material which is part of the connector shown in FIG. 9.

Referring particularly to FIG. 14 it will be seen that the shield bus layer 94 extends toward the terminal connection end 96 only to a location between the signal conductor connecting zone 100 and the signal conductor termination window 108. A narrow thermal break opening 116 is defined in the shield bus layer 94 between the shield conductor connection zone 104 and the signal conductor connecting zone 100, near the cable connection end 98 of the connector 90. A similar thermal break opening 118 is located adjacent the shield bus terminal zone 112. The thermal break openings 116 and 118 limit the transfer of heat through the shield bus layer 94, between the shield conductor connection zone 104 and the signal conductor connecting zone 100, and between the shield bus terminal zone 112 and the adjacent central portion 120 of the shield bus layer 94, beneath the central portions of the signal conductor traces 92. This configuration of the shield bus layer 94 helps to keep heat where it is needed during soldering of the shield bus terminal zone 112 to a circuit conductor terminal 59 beneath the connector 90, as well as protecting the connections of central conductors 30 to the signal conductor traces 92 in the signal conductor connecting zone 100 and connections of the terminal portions 121 of the signal conductor traces 92 to the terminals 58 of the electrical circuit 27.

Figure 11:
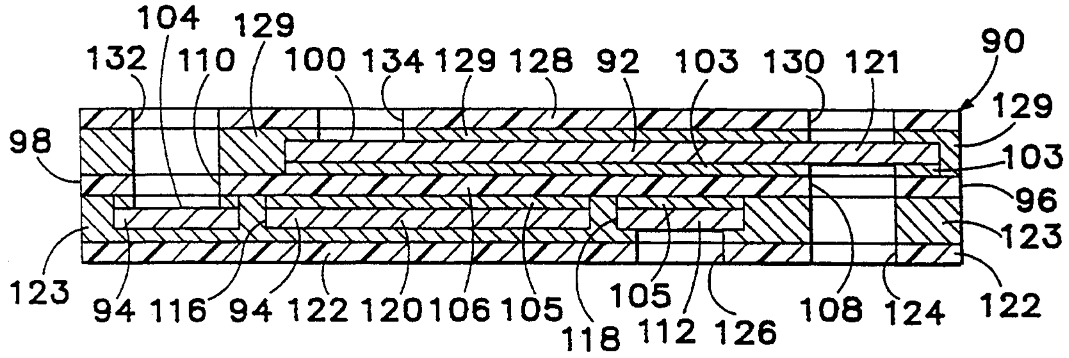
FIG. 11 is a sectional view of the connector shown in FIG. 9, taken along line 11—11, with the scale in the direction of the thickness of the connector exaggerated for the sake of clarity.
Figure 4:
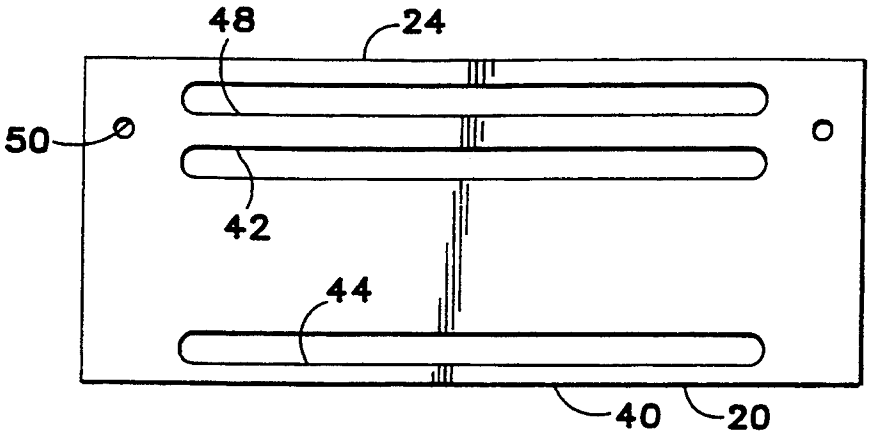
FIG. 4 is a top plan view, at a reduced scale, of the central layer of dielectric material of the connector shown in FIG. 1.
Figure 5:
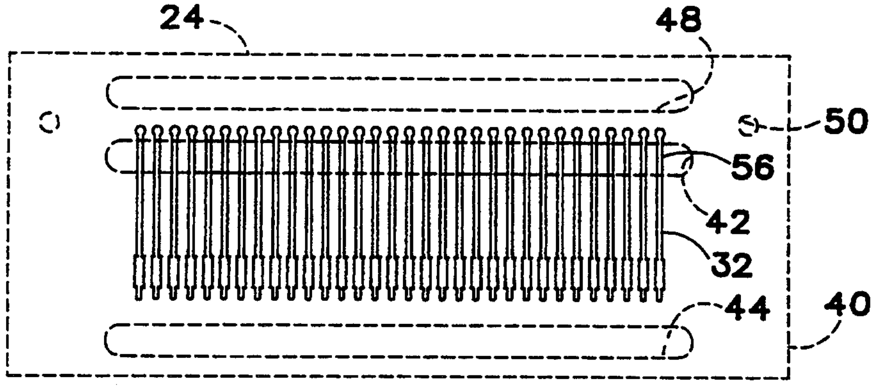
FIG. 5 is a top plan view of the signal conductors of the connector shown in FIG. 1 together with which the central layer of dielectric material is shown in phantom.

An insulating bottom layer 122 of dielectric material, similar to the material of the central layer 106, is attached to the shield bus layer 94 by a layer 123 of adhesive (FIG. 11). The bottom layer 122 of dielectric material defines an opening 124 located in registration with the signal conductor termination window 108, and an opening 126 located in registration with the shield bus terminal zone 112. Solder flow verification openings 127 are defined through the shield bus terminal zone 112 of the shield bus layer 94 at each side of the connector 90, clear of likely flow of solder to the signal conductor traces 92, to enable a visual inspection to reveal whether the solder has flowed sufficiently to effect satisfactory mechanical and electrical interconnection between the shield bus terminal zone 112 and a corresponding conductor terminal.

As in the connector 20, the connector 90 includes a top layer 128 of insulating dielectric material attached to the central layer 106 and the signal conductor traces 92 by a layer 129 of adhesive (FIG. 11). The top layer 128 defines an window 130 located in registration with the signal conductor termination window 108 near the terminal connection end 96 of the connector 90. Near the cable connection end 98 of the connector 90, the top layer 128 also defines an window 132 located above and in registration with the shield conductor connection zone 104 and the shield conductor connection window 110. An window 134, exposing the signal conductor connecting zone 100 of the signal conductor traces 92, is also defined by the top layer 128 of dielectric material to permit the central conductors 30 to be soldered to the respective conductor traces 92.

As in the connector 20, each of the signal conductor traces 92 is tinned in the signal conductor connecting zone 100, and the shield bus layer 94 is tinned in the shield conductor connection zone 104, to facilitate connection of the coaxial conductor pairs 26 to the connector 90. Also, the terminal portions of the signal conductor traces 92 exposed in the signal conductor termination window 108 and the bottom surface of the shield bus terminal zone 112, that is, the surface exposed through the opening 126 and facing toward a circuit to which the connector 90 is to be connected, are preferably tinned.

Figure 17:
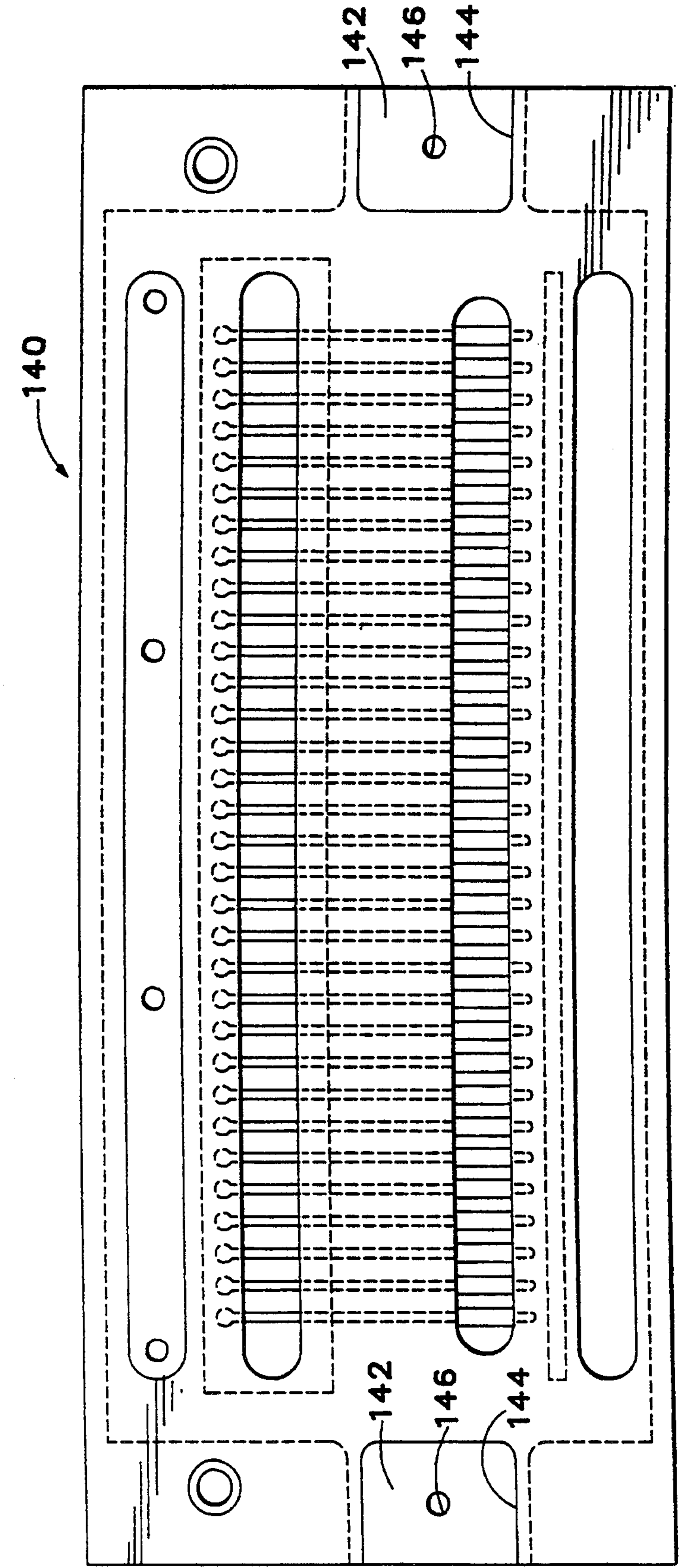
FIG. 17 is a top plan view of a connector which is an alternative embodiment of the invention.

A connector 140, shown in FIG. 17, is another alternative embodiment of the invention, similar to the connector 20, but additionally includes hold-down tabs 142 which are extensions of the shield bus layer, and corresponding hold-down tab openings 144 are defined in the layers of dielectric material above and below the shield bus layer defining the hold-down tabs 142. The hold-down tabs 142 are tinned, and solder flow verification holes 146 are defined in the hold-down tabs 142. The hold-down tabs 142 thus can be soldered, and the flow of solder to form such a connection can be verified, so that the hold-down tabs 142 keep the connector 140 securely attached mechanically to the surface of a circuit assembly to protect the connections of the signal conductor trace terminal portions 56 from mechanical stress resulting from tension in a cable whose coaxial conductor pairs are connected by use of the connector 140.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A connector for electrically connecting a plurality of electrical conductors to a plurality of electrical terminals located close to one another in an array, comprising:

(a) a central layer of a dielectric material;

(b) a plurality of signal conductors disposed on a first side of said central layer, each said signal conductor having a cable conductor end and a terminal connection end, and said signal conductors having terminal portions, adjacent said terminal connection end, extending generally parallel with each other at a predetermined spacing on said central layer of dielectric material;

(c) a shield bus layer of electrically conductive material disposed on a second side of said central layer;

(d) said central layer of dielectric material defining a signal conductor termination window opening therethrough, and a part of said terminal portion of each of said plurality of signal conductors extending across said signal conductor termination window; and (e) said central layer of dielectric material defining a shield conductor connection window opening located proximate said cable conductor end of said connector.

2. The connector of claim 1, including a second layer of dielectric material disposed atop said plurality of signal conductors and defining a shield conductor connection opening located in registration with said shield conductor connection window defined in said central layer of dielectric material.

3. The connector of claim 2 wherein said central layer and said second layer of dielectric material each define a shield bus terminal zone window, said shield bus terminal zone windows being located in registration with each other and exposing a portion of said shield bus layer.

4. The connector of claim 1 wherein said shield bus layer includes a shield terminal Zone and defines a solder flow verification hole located in said shield terminal zone.

5. The connector of claim 1 wherein said signal conductors extend beyond said shield bus layer toward said terminal end of said connector, and wherein said signal conductor termination window is located between said shield terminal zone of said shield bus layer and said terminal end of said connector.

6. The connector of claim 1 wherein said signal conductor termination window is located proximate said terminal end of said connector and said shield bus layer defines a shield terminal zone located between said signal conductor termination window and said cable conductor end of said connector.

7. The connector of claim 6, said shield bus layer further defining a thermal break opening adjacent said shield terminal zone.

8. The connector of claim 7 wherein said thermal break opening in said shield bus layer is located between said shield terminal zone and said signal conductor connection zone.

9. The connector of claim 1 wherein said shield bus layer includes a shield conductor connecting zone proximate said cable conductor end of said connector.

10. The connector of claim 9 wherein said central layer of dielectric material defines a shield connecting zone window registered above said shield conductor connecting zone of said shield bus layer.

11. The connector of claim 9 wherein said shield bus layer defines thermal break means adjacent said shield conductor connecting zone for limiting heat transfer from said shield conductor connecting zone.

12. The connector of claim 1 wherein said shield bus terminal zone of said shield bus layer is located between said signal conductor termination window and said terminal connection end of said connector.

13. The connector of claim 1, further including registration means for guiding placement of said connector with respect to an array of circuit conductor terminals to which said signal conductors and said shield bus layer are to be connected electrically.

14. The connector of claim 13 wherein said registration means includes a plurality of registration pin holes defined in at least said central layer of dielectric material.

15. A connector for connecting a circuit to signal conductors and a shield of a cable comprising:

a shield bus layer on one side of an inner layer of dielectric material, a first portion of the shield bus layer for connection to a circuit, a window through the inner layer exposing a second portion of the shield bus layer for connection to a shield of a cable, signal conductor traces for connection to signal conductors of a cable on another side of the inner layer, and an opening through the inner layer exposing portions of the traces for connection to a circuit.

16. A connector as recited in claim 15, comprising:

a second window through the inner layer exposing the first portion of the shield bus layer.

17. A connector as recited in claim 15, comprising:

a second window through the inner layer exposing the first portion of the shield bus layer, and a solder verification opening through the first portion of the shield bus layer in alignment with the second window.

18. A connector as recited in claim 15, comprising:

a thermal break opening through the shield bus layer being adjacent to the second portion of the shield bus layer.

19. A connector as recited in claim 15, comprising:

an opening through the shield bus layer being adjacent to the first portion of the shield bus layer.

20. A connector as recited in claim 15, comprising:

an opening through the shield bus layer being adjacent to the first portion of the shield bus layer, and being aligned with the opening through the second portion of the inner layer.

21. A connector as recited in claim 15, comprising:

a second layer of dielectric material extending over the shield bus layer and extending over part of the inner layer, a second opening through the second layer exposing said first portion of the shield bus layer, and a third opening through the second layer aligned said the opening through the inner layer exposing said portions of the traces.

22. A connector as recited in claim 21, comprising:

a fourth opening through the shield bus layer aligned with the third opening and aligned with the opening through the inner layer exposing said portions of the traces.

23. A connector as recited in claim 21, comprising:

a thermal break opening extending through the shield bus layer adjacent to the first portion of the shield bus layer.

24. A connector as recited in claim 21, comprising:

a second window through the inner layer exposing the first portion of the shield bus layer.

25. A connector as recited in claim 21, comprising:

a second window through the inner layer exposing the first portion of the shield bus layer, and a solder verification window through the first portion of the shield bus layer.

26. A connector as recited in claim 21, comprising:

an opening through the shield bus layer being adjacent to the first portion of the shield bus layer.

27. A connector as recited in claim 21, comprising:

an opening through the shield bus layer being adjacent to the first portion of the shield bus layer, and being aligned with the opening through the second portion of the inner layer.

28. A connector as recited in claim 15, comprising:

at least one additional layer of dielectric material over the traces and over part of the inner layer, a second window through the additional layer and aligned with said window through the inner layer exposing the second portion of the shield bus layer, and a third window through the additional layer exposing the portions of the traces.

29. A connector as recited in claim 28, further characterized by; a fourth window through the additional layer exposing said portions of the traces.

30. A connector as recited in claim 28, comprising:

a thermal break opening extending through the shield bus layer adjacent to said second portion of the shield bus layer.

31. A connector as recited in claim 28, comprising:

an opening through the shield bus layer being adjacent to said first portion of the shield bus layer.

32. A connector as recited in claim 28, comprising:

an opening through the shield bus layer being adjacent to said first portion of the shield bus layer, and being in alignment with said opening through said inner layer.

33. A connector as recited in claim 28, comprising:

aligned windows through the additional layer and through the inner layer, the aligned windows exposing said first portion of the shield bus layer.

34. A connector as recited in claim 28, comprising:

a solder verification opening through the first portion of the shield bus layer and being in alignment with the aligned windows.

35. A connector as recited in claim 28, comprising:

a second additional layer of flexible dielectric material over the shield bus layer and over part of the inner layer, a second opening through the second additional layer exposing the first portion of the shield bus layer, and a third opening through the second additional layer and aligned with said opening through the inner layer exposing said portions of the traces.

36. A connector as recited in claim 35, comprising:

aligned windows through the first additional layer and through the inner layer, the aligned windows being aligned with the second opening.

37. A connector as recited in claim 35, comprising:

a solder verification window through said first portion of the shield bus layer.

38. A connector as recited in claim 35, comprising:

a solder verification window through said first portion of the shield bus layer, and being aligned with said second opening.

39. A connector as recited in claim 35, comprising:

a thermal break opening extending through the shield bus layer adjacent to said second portion of the shield bus layer.

40. A connector as recited in claim 35, comprising:

an opening through the shield bus layer being adjacent to said first portion of the shield bus layer.

41. A connector as recited in claim 35, comprising:

an opening through the shield bus layer being adjacent to said first portion of the shield bus layer, and being in alignment with said opening through said inner layer.

* * * * *